METHOD OF FABRICATING ELECTRICAL DEVICES

Filed Nov. 30, 1965

INVENTORS
Hans-Jürgen Schütze &
Klaus Hennings
BY Spencer & Kaye
ATTORNEYS 3,462,322

METHOD OF FABRICATING ELECTRICAL DEVICES

Klaus Hennings and Hans-Jürgen Schütze, Ulm (Danube), Germany, assignors to Telefunken Patentverwertungs-G.m.b.H., Ulm (Danube), Germany Filed Nov. 30, 1965, Ser. No. 510,547
Claims priority, application Germany, Dec. 19, 1964, T 27,666
Int. Cl. H01l 7/36
U.S. Cl. 148—175 9 Claims

ABSTRACT OF THE DISCLOSURE

A method for producing a multilayer semiconductor body composed of an epitaxial layer disposed on an extremely low-resistivity substrate by forming the epitaxial layer in one side of a substrate of moderately low resistivity, depositing an insulating layer and then a temporary supporting layer on the one side of the substrate, removing a layer of the substrate from the other side thereof, depositing a layer of heavily doped semiconductor material on such other side of the substrate, and removing the temporary supporting layer to produce a body having an extremely low-resistivity substrate carrying an epitaxial layer, which body is to be used as a starting material for the production of transistors having extremely short switching times.

Figure 1:
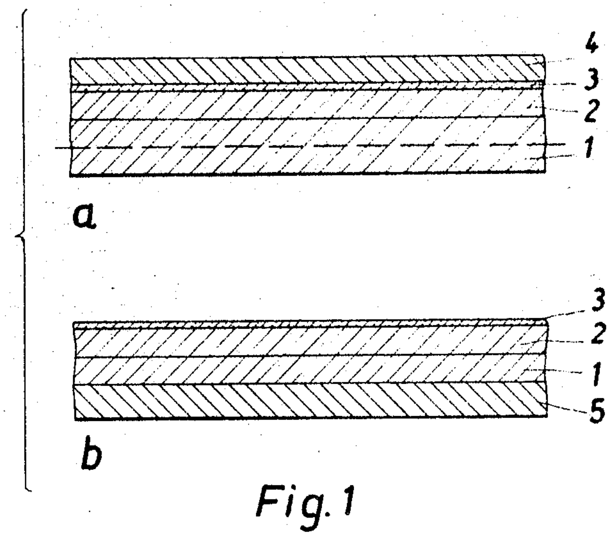

The present invention relates to a method for producing electrical devices, and particularly to a method for producing a solid-state semiconductor unit.

This invention is particularly concerned with the production of a semiconductor unit having one or more epitaxial layers disposed on a substrate whose resistivity is substantially lower than that of the epitaxial layers. Such units are generally required for the production of transistors having a low collector path resistance. For the production of such transistors, the semiconductor bodies which have generally been used have a thin epitaxial layer having a resistivity of about 1 ohm-cm. disposed on a low resistivity substrate of the same type of conductivity as the epitaxial layer, the substrate having a resistivity of the order of $10^{-3}$ to $5 \times 10^{-3}$ ohm-cm. In may cases, however, an improved transistor would be obtained if the substrate had an even lower resistivity.

Such is the case, for example, for switching transistors in which a reduction in the collector path resistance and hence in the saturation voltage, is sought. This is particularly true when the semiconductor body of the transistor has been subjected to a gold diffusion in order to achieve shorter switching times, such a diffusion leading not only to an increase in the charge carrier recombination rate, but also to an undesirable increase in the resistivity. Extremely low resistivity substrates are also desirable in the fabrication of power transistors, particularly for very high frequency power transistors. These transistors are generally operated under a large load and require a collector having a low resistivity in order to reduce the quantity of heat generated in the collector path region.

There are, however, two major objections to the use of extremely low resistivity materials for substrates in semiconductor components. Firstly, it is very difficult to grow high resistivity epitaxial layers on a low resistivity substrate because of the tendency of doping atoms to diffuse out of the substrate during the growth process. Secondly, in the case of very heavily doped substrate materials, the crystal lattice structure of these materials is disturbed, these disturbances extending for some distance into the epitaxially grown layer. Moreover, doping atoms diffuse, even after growth, out of the low resistivity substrate into the epitaxial layer, or layers, during subsesuent temperature treatments.

It is a primary object of the present invention to overcome these difficulties.

It is a more specific object of the invention to permit the fabrication of units having epitaxial layers mounted on a substrate having a very low resistivity while avoiding the above-noted difficulties.

These results are achieved by the method of the present invention according to which a layer of insulating material is deposited on one surface of a semiconductor body, for example by thermal oxidation. A supporting layer, for example of polycrystalline semiconductor material, is then deposited onto this insulating layer after which a layer of material is removed from the semiconductor body, starting from that surface of the body which is furthest removed from the insulating layer, in order to give the body a predetermined thickness. Thereafter, a layer of heavily doped to extremely doped semiconductor material is deposited on the surface of the semiconductor body which is formed by the removal of material therefrom. Finally, the previously applied supporting layer is removed.

The above-described process thus makes it possible to fabricate a semiconductor body having one or more epitaxial layers disposed on an extremely low resistivity substrate while retaining the advantages of a semiconductor substrate layer having a higher resistivity.

Additional objects and advantages of the present invention will become apparent upon consideration of the following description when taken in conjunction with the accompanying drawings in which:

FIGURES 1*a* and 1*b* are longitudinal, cross-sectional views illustrating two stages in the process of the present invention.

FIGURES 2*a* and 2*b* are longitudinal, cross-sectional views illustrating two stages in the fabrication of a modified unit by the process of this invention.

Referring first to FIGURE 1, there is shown a semiconductor body having a low resistivity substrate 1 whose resistivity is, for example, of the order of $5 \times 10^{-3}$ to $10^{-2}$ ohm-cm. Such a substrate, which does not have a particularly low resistivity, permits the formation, without difficulty, of perfect epitaxial layers such as the higher resistivity epitaxial layer or layers 2. The surface of the substrate 1 on which these layers are formed is coated with an insulating layer 3 by thermal oxidation, for example. Then, a supporting layer 4, for example of polycrystalline semiconductor material, is deposited on the insulating layer 3 as shown in FIGURE 1*a*. The creation of the supporting layer 4 can be accomplished by a deposition from the gaseous phase, for example. A layer of material is then removed from the bottom of substrate 1, up to the broken line, for example, so as to leave a semiconductor body having a thickness of about 10 to 30 microns, which is preferably greater than the thickness of the higher resistivity epitaxial layer 2. Then a layer 5 of extremely heavily doped semiconductor material having a resistivity of the order of $10^{-3}$ to $10^{-4}$ ohm-cm. or smaller, for example, is precipitated from the gaseous phase on the surface of the semiconductor body which has been exposed by the removal of a layer of material therefrom. Because of the heavy doping of the layer 5, it is immaterial whether or not this layer is deposited in polycrystalline form. Finally, the supporting layer 4, which was only provided as a temporary support for the unit during the removal of the layer of material from the semiconductor body, is removed, thereby resulting in the arrangement shown in FIGURE 1*b*. The removal of the supporting layer 4 is carried out, for example, through the use of a selective etching agent which only attacks the material of the layer 4 and which does not affect the material of the insulating layer 3, with the result that the removal of the layer 4 is automatically limited by the presence of the insulating layer 3.

The removal of a portion of the substrate 1, in accordance with the present invention, is effected, for example, by chemical etching. A material removal operation of this type is desirable because it has the effect of avoiding disturbances in the crystal structure of the remaining substrate portion. It is easily possible to maintain any surface irregularities which might be produced by such a removal process to within the required limits of, for example, 10 microns. Irregularities of this magnitude, as well as any other irregularities of a similar magnitude which might exist in the thickness of the remaining substrate layer, have no noticeable effect on the electrical characteristics of the resulting components. If these irregularities must be kept within smaller tolerances, however, it is also possible, according to the present invention, to employ a mechanical removal procedure. Although such a procedure might create a slight disturbance of the crystal structure of the remaining substrate portion down to a depth of 1 or 2 microns, such a disturbance is not serious because it will not affect the performance of the structural components which are finally produced.

Figure 2:
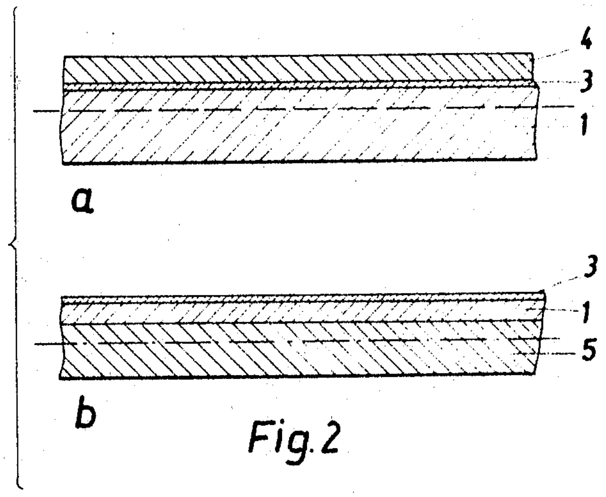

Turning now to FIGURE 2, there is shown another application of the process of the present invention, in which a semiconductor body 1, which may be homogeneous, for example, is covered with an insulating layer 3 and then a supporting layer 4. Then, a layer of the semiconductor body is removed, up to the broken line of FIGURE 2*a*, for example, to give the layer a desired thickness. Next, a conductive layer 5 is deposited on the side of body 1 from which the layer of material has been removed.

In accordance with one feature of the present invention, it is possible to form the layer 5 of a plurality of individual layers having different dopings. For example, a layer of low-resistivity material may be deposited directly on the body 1 so as to extend as far as the dot-dash line shown in FIGURE 2*b*, and a layer of material having an even lower resistivity may then be deposited on the low-resistivity layer. Alternately, the layer 5 may be constituted by a single layer whose doping is varied throughout the thickness of the layer. Such a layer may be produced, for example, by growing the layer 5 on body 1 in a growth reactor while varying the doping of the layer as it grows thicker. Such a variable doping is preferably carried out in such a manner that the layer 5 has a low resistivity in the region adjacent body 1 and an even lower resistivity in the region removed from body 1.

In accordance with the present invention, the doping applied to each of the above-mentioned layers may have either type of conductivity.

In all the procedures for generation of very low resistivity epitaxial substrates, i.e. resistivities below $10^{-3}$ ohm-cm., a number of materials may be used. Phosphorus, for example, has a solid solubility of $1.5 \times 10^{21}$ atoms per cubic centimeter in silicon at 1250° C. The resistivity then is about $2 \times 10^{-4}$ ohm-cm. Silicon and phosphorus are preferably deposited in an epitaxial furnace from $SiCl_4$ and $PCl_3$ sources, respectively. Allowing for polycrystalline growth, the resistivity can be further reduced by a factor of 2 to 5.

Another method, in particular in connection with FIG. 2, is the code-position of silicon and molybdenum in an epitaxial furnace at temperatures around 1200° C. Silicon tetrachloride and molybdenum pentachloride are the corresponding source materials. Molybdenum disilicide is formed on the seed and provides for resistivity of about $2 \times 10^{-5}$ ohm-cm.

Finally, for removal of the carrier material 4 a simple selective etch may be used, such as a mixture of concentric hydrofluoric acid and nitric acid in a ratio of 5 to 3. With such a solution, the etching speed for silicon over the etching speed for silicon dioxide is equal to a ratio of approximately 40 to 1.

It should be appreciated from the above description that none of the parameters of any of the operations of the method of the present invention are critical. For example, it is possible, when practicing the method of the invention, to increase the conductivity of the substrate of an epitaxial semiconductor body by about one or two orders of magnitude without impairing the quality of the epitaxial layers and without appreciably increasing the cost of the resulting body.

It will be understood that the above description of the present invention is susceptible to various modifications, changes and adaptations, and the same are intended to be comprehended within the meaning and range of equivalents of the appended claims.

What is claimed is:

1. A method for producing an epitaxial semiconductor body having an extremely low-resistance substrate and at least one superposed higher-resistance semiconductor layer, comprising the steps of:

(a) depositing a layer of insulating material on one surface of a semiconductor body;
(b) depositing a supporting layer on the insulating layer;
(c) removing a layer of material, starting from that surface of the semiconductor body which is furthest removed from the insulating layer, to give the body a predetermined thickness;
(d) depositing a layer of heavily doped semiconductor material on that surface of the semiconductor body which is formed by said removal of material; and
(e) removing the supporting layer.

2. A method as defined in claim 1 wherein the depositing of an insulating layer is carried out by thermal oxidation.

3. A method as defined in claim 1 wherein the supporting layer is made of polycrystalline semiconductor material.

4. A method as defined in claim 1 wherein the depositing of doped semiconductor material is effected by a precipitation from the gaseous phase.

5. A method as defined in claim 1 wherein the semiconductor body is constituted by at least one epitaxial layer on a substrate.

6. A method as defined in claim 5 wherein said at least one epitaxial layer is disposed on that surface of said semiconductor body on which said layer of insulating material is deposited.

7. A method as defined in claim 1 wherein the layer of doped semiconductor material has a varying degree of doping in the direction of its thickness.

8. A method as defined in claim 1 wherein the removal of material from the semiconductor body is effectuated by chemical etching and the removal of the supporting layer is effectuated by a selective etching process.

9. A method as defined in claim 1 wherein the doped semiconductor material has a resistivity which is substantially lower than that of the portion of the semiconductor body remaining after the removal of a layer of material therefrom.

References Cited

UNITED STATES PATENTS

| | | | |
|---|---|---|---|
| 2,904,613 | 9/1959 | Paradise | 29—577 |
| 3,256,587 | 6/1966 | Hangstefer | 29—577 |
| 3,290,753 | 12/1966 | Chang. | |
| 3,300,832 | 1/1967 | Cave. | |
| 3,326,729 | 6/1967 | Sigler | 29—577 |

FOREIGN PATENTS

| | | |
|---|---|---|
| 817,953 | 8/1959 | Great Britain. |

L. DEWAYNE RUTLEDGE, Primary Examiner
PAUL WEINSTEIN, Assistant Examiner

U.S. Cl. X.R.

29—423, 424, 577, 580; 117—106, 201, 212; 156—17